US008374007B2

United States Patent
Hu et al.

(10) Patent No.: US 8,374,007 B2
(45) Date of Patent: Feb. 12, 2013

(54) SUPPLYING POWER WITH MAINTAINING ITS OUTPUT POWER SIGNAL WITH THE ASSISTANCE OF ANOTHER POWER APPLY AND METHOD THEREFOR

(75) Inventors: Chih-Ting Hu, Tainan (TW);
Chun-Hsiung Hung, Hsinchu (TW);
Chuan-Ying Yu, Zhubei (TW);
Wu-Chin Peng, Xizhi (TW);
Kuen-Long Chang, Taipei (TW);
Ken-Hui Chen, Dali (TW)

(73) Assignee: Macronix International Co., Ltd., Hsinchu (TW)

( * ) Notice: Subject to any disclaimer, the term of this patent is extended or adjusted under 35 U.S.C. 154(b) by 301 days.

(21) Appl. No.: 12/820,422

(22) Filed: Jun. 22, 2010

(65) Prior Publication Data
US 2011/0227552 A1 Sep. 22, 2011

Related U.S. Application Data

(60) Provisional application No. 61/314,214, filed on Mar. 16, 2010.

(51) Int. Cl.
*H02M 7/25* (2006.01)
*H02M 7/00* (2006.01)

(52) U.S. Cl. ............ 363/60; 363/59; 327/538; 327/539; 327/540; 327/541; 327/543; 307/109; 307/110

(58) Field of Classification Search .................. 363/59, 363/60; 327/538, 539, 540, 541, 543; 307/109, 307/110
See application file for complete search history.

(56) References Cited

U.S. PATENT DOCUMENTS

| 5,280,455 | A | * | 1/1994 | Kanaishi | .................. 365/229 |
| 5,511,026 | A | | 4/1996 | Cleveland et al. | |
| 5,812,017 | A | | 9/1998 | Golla et al. | |
| 6,400,213 | B2 | * | 6/2002 | Shih et al. | .................. 327/540 |
| 6,677,804 | B2 | * | 1/2004 | Pekny | .................. 327/535 |
| 6,754,111 | B2 | * | 6/2004 | Pekny | .................. 365/189.09 |
| 7,023,754 | B2 | * | 4/2006 | Akiyama et al. | .................. 365/226 |
| 7,177,219 | B1 | * | 2/2007 | Herbert et al. | .................. 365/211 |
| 2003/0151957 | A1 | * | 8/2003 | Pekny | .................. 365/189.11 |
| 2004/0027866 | A1 | * | 2/2004 | Pekny | .................. 365/189.09 |

* cited by examiner

*Primary Examiner* — Bao Q Vu
(74) *Attorney, Agent, or Firm* — McClure, Qualey & Rodack, LLP

(57) ABSTRACT

A power supply apparatus and a method for supplying power are provided. The apparatus, for use in a system having a first power signal, includes an assistance unit and a power supply device. The assistance unit outputs at least one maintaining signal according to the first power signal selectively. The power supply device outputs a second power signal, wherein the power supply device maintains the second power signal according to the at least one maintaining signal, for example, in an inactive state, such as an idle or standby state or other suitable timing.

14 Claims, 5 Drawing Sheets

SUPPLYING POWER WITH MAINTAINING ITS OUTPUT POWER SIGNAL WITH THE ASSISTANCE OF ANOTHER POWER APPLY AND METHOD THEREFOR

This application claims the benefit of Provisional Application Ser. No. 61/314,214, filed Mar. 16, 2010, the subject matter of which is incorporated herein by reference.

BACKGROUND OF THE INVENTION

1. Field of the Invention

The invention relates in general to a power supply device, and more particularly to a power supply apparatus maintaining its output power signal with the assistance of another power supply.

2. Description of the Related Art

Integrated circuit memory technology continues to evolve toward smaller and smaller geometries. While reductions in channel-lengths and gate-oxide thicknesses in metal-oxide-semiconductor memories can be used in low power system.

Data in memories must be read out in a short time. Thus, the word line is selected and is applied a high voltage to read the memory data. In general, there are two methods to generate high voltage power in the low power system. First method is using boost circuit. A high voltage power can be obtained rapidly by using boost circuit method, but it will take a huge die area and produce a big power noise bounce. The other method is using the charge pump circuit. The charge pump method takes smaller die area then the boost method, so do the power noise.

In some operation condition, the charge pump circuit must apply a high voltage to a specific substrate or word line to make the function correct. In a low power system, the charge pump circuit constructs more stages to supply a predetermined high voltage. In this situation, the charge pump will spend more time to build up internal voltage.

When a read function is executed, all data line pass gates are applied a system power to pass memory data to sense amplifier. In a low power system, the memory drain side will apply a voltage about 1V for reading data. Thus, the memory data will pass through all data lines' pass gates to the sense amplifier to determine whether memory data is 0 or 1. Unfortunately, the read out data signal will be suppressed because all pass gate voltages are not enough to fully pass the data signal. The sense amplifier may receive a wrong data signal. It will suffer a read problem.

SUMMARY OF THE INVENTION

The invention is directed to a power supply apparatus and a method for supplying power. With the assistance using a first output power signal, e.g., of a standby power supply, the power supply apparatus is enabled to maintain an output power signal, for example, during an idle or standby state or other suitable timing. The power supply apparatus is assisted by sharing a standby power signal of the standby power supply with the power supply apparatus or triggering the power supply apparatus to be refreshed with a detection signal of the standby power signal. In some embodiments, the power supply apparatus with different type of power circuit can be enabled to maintain an output power signal during a period of time, e.g., during an idle or standby state, thereby reducing the standby current. Accordingly, the time spent to build up internal voltage of the power supply device such as charge pump can be reduced.

According to an aspect of the invention, an apparatus for supplying power is provided. The apparatus, for use in a system having a first power signal, includes an assistance unit and a power supply device. The assistance unit outputs at least one maintaining signal according to the first power signal selectively. The power supply device outputs a second power signal, wherein the power supply device maintains the second power signal according to the at least one maintaining signal.

According to another aspect of the invention, a method for supplying power is provided. The method includes the following steps. First, a first power supply is used to output a first power signal. A second power supply is used to output a second power signal. At least one maintaining signal is selectively outputted according to a first power signal from a first power supply to the second power supply to maintain the second power signal.

The above and other aspects of the invention will become apparent from the following detailed description of the preferred but non-limiting embodiments. The following description is made with reference to the accompanying drawings.

DETAILED DESCRIPTION OF THE INVENTION

The invention is directed to a power supply apparatus and a method for supplying power. At least one maintaining signal is outputted selectively according to an output power signal, e.g., from a standby power supply, to another power supply to maintain its power signal. For example, the power supply apparatus is enabled to maintain an output power signal during a specific period of time with the assistance using an output power signal of a standby power supply. The power supply apparatus is assisted by sharing a standby power signal of the standby power supply with the power supply apparatus or triggering the power supply apparatus to be refreshed with a detection signal of the standby power signal. In some embodiments, the power supply apparatus with different type of power circuit can be enabled to maintain an output power signal during a period of time, e.g., during an idle or standby state or when the number of refreshing times of the standby power supply reaches a target value. Accordingly, the standby current can be reduced.

FIRST EMBODIMENT

Figure 1:
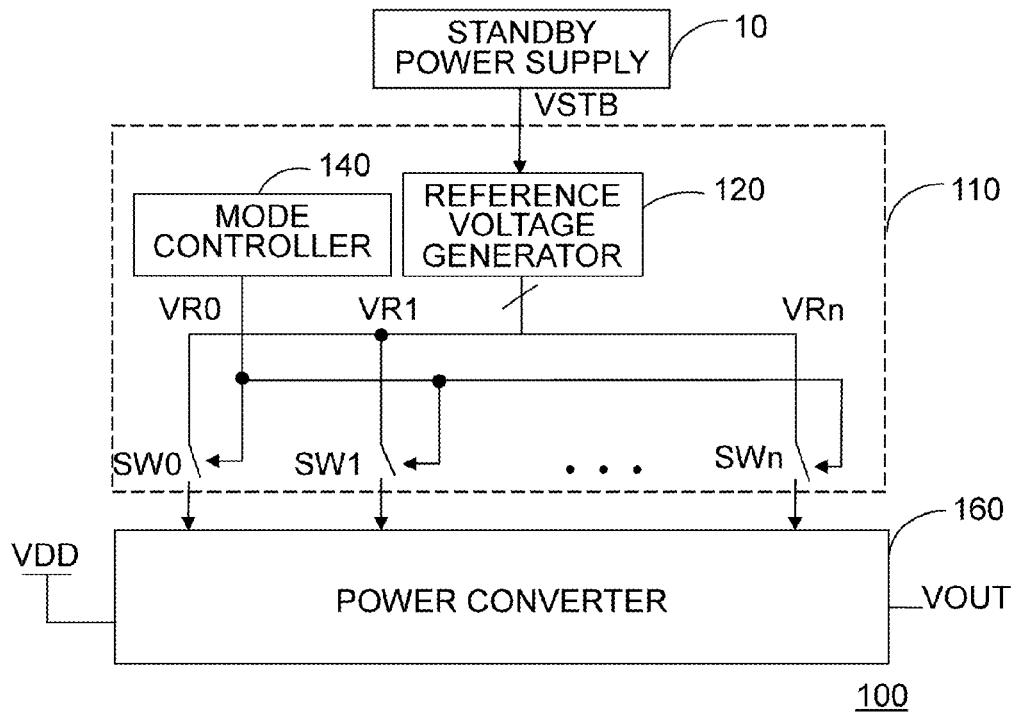
FIG. 1 illustrates a power supply apparatus according to a first embodiment of the invention.

Referring to FIG. 1, a power supply apparatus according to a first embodiment of the invention is shown. For example, the power supply apparatus 100 as well as the standby power supply 10 is employed as internal power sources of a chip or system, such as a memory device or module, or other integrated circuits. In FIG. 1, a standby power supply 10 shares a standby power signal VSTB of the standby power supply 10 with the power supply apparatus 100 during a specific period of time, e.g., during an idle or standby state or other state. The power supply apparatus 100 includes a power converter 160, e.g., a charge pump or a boost circuit, as will be discussed, to provide an output power signal VOUT, e.g., a high voltage signal. In addition, the power supply apparatus 100 further includes an assistance unit 110 selectively providing a plurality of maintaining signals for the power converter 160 to maintain its output voltage VOUT according to the standby power signal VSTB. In FIG. 1, the assistance unit 110 includes, for example, a reference voltage generator 120, a mode controller 140, and a plurality of switching elements SW0-SWn, so as to make use of the standby power signal VSTB from the standby power supply 10 during an idle or standby state, wherein n is a positive integer and corresponds to the requirements for the power converter 160.

Figure 3A:
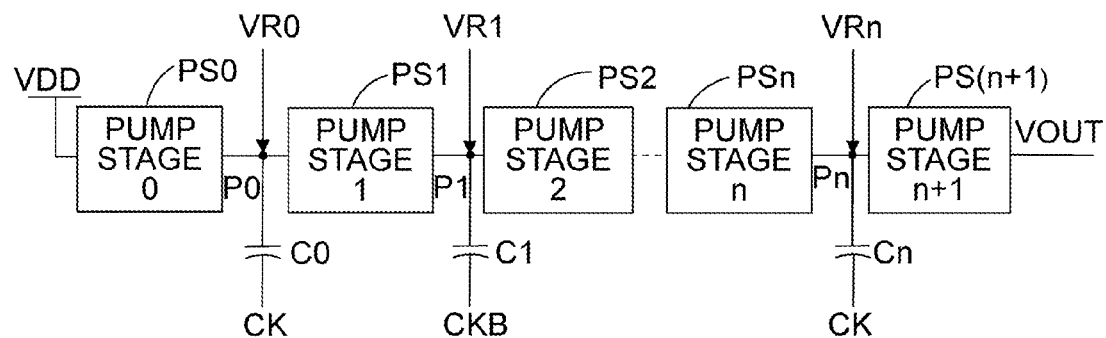
FIG. 3A is an example of a charge pump serving as a power converter 160 of the power supply apparatus 100 in FIG. 1.

A charge pump, such as one shown in FIG. 3A, is taken as an example of the power converter 160 for illustration. Specifically, in FIG. 3A, the charge pump 300 generates an output voltage VOUT (e.g., 6 or 27V) from a system input power VDD (e.g., 3V). The charge pump 300 includes a plurality of charge pump stages and each charge pump stage is accompanied with a capacitor (e.g., PUMP STAGE 0 PS0 with a capacitor C0), and is controlled by a clock, CK or CKB, to generate a high voltage output at each stage's output node (e.g., P0, P1, ..., Pn) and the last stage for providing the output signal VOUT of the charge pump 300. In ideal case, each charge pump stage will fully charge sharing from previous pump stage (e.g., PS0) to next pump stage (e.g., PS1). However, when the chip in the idle state for a long time, the charge of the capacitor of the charge pump 300 will lose through elements such as metal-oxide semiconductor (MOS) transistor to ground. Because MOS is not an ideal component, it suffers a small leakage current to ground.

In general, a charge pump is a kind of DC-DC converter that uses capacitors as energy storage elements to create either a higher or lower voltage power source and thus suffers current leakage of the capacitors after setting up for a period of time. In this example, the charge pump 300 is used for outputting a high voltage signal (VOUT) and the assistance unit 110 employs the standby power signal VSTB to selectively produce suitable reference signals VR0 to VRn, i.e., the maintaining signals, to the power converter 160 so that the voltage charge in each pump stage is maintained. In addition, the switching elements SW0-SWn are coupled to nodes P0 to Pn of the charge pump 300, respectively, and FIG. 3A illustrates that the reference signals VR0-VRn are applied to the nodes P0-Pn during an idle state or other appropriate state.

Figure 2A:
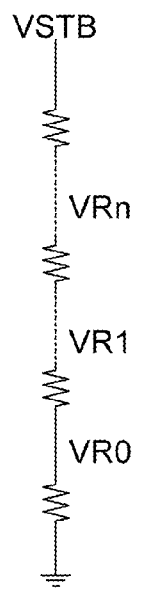
FIGS. 2A-2B show examples of a reference voltage generator as shown in FIG. 1.
Figure 2B:
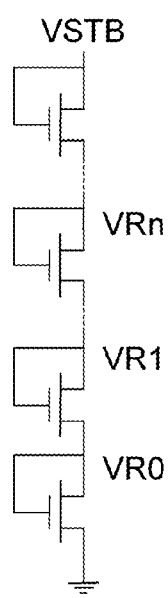

Referring to FIGS. 1 and 3A, the reference voltage generator 120 uses the standby power signal VSTB, e.g., a voltage signal of 6V or 6.5V, from the standby power supply 10 to produce reference signals VR0-VRn, i.e., the maintaining signals, to sustain sufficient voltage levels at the nodes P0-Pn, i.e., sufficient charge in the capacitors C0-Cn of the charge pump 300. For example, a voltage divider of serially-connected resistors is taken as the reference voltage generator 120 to output the reference signals VR0-VRn, as shown in FIG. 2A. In this way, the reference signals VR0-VRn can be set to a series of increasing voltages for the charge pump stages, i.e., PS0-PSn, of the charge pump 300 with increasing capacitor voltages, respectively. FIG. 2B illustrates an implementation of the voltage divider in FIG. 2A in terms of serially-connected transistors.

Figure 2C:
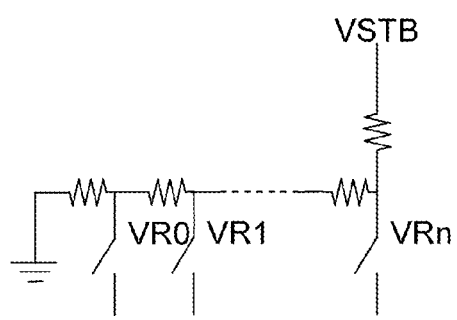
FIG. 2C illustrates an example of arrangement in which the reference voltage generator can be combined with the switching elements.

The reference voltage generator 120 can also be combined with the switching elements SW0-SWn in different arrangements, for example, as shown in FIG. 2C. In addition, the reference voltage generator 120, as shown in FIGS. 2A-2C, can be implemented by other circuit elements, e.g., resistances, transistors such as PMOS, NMOS, or CMOS, in serial and/or parallel, or code-controlled voltage divider, or switched capacitors. In further examples, the number of maintaining signals of the assistance unit 110 may be less than or greater than the number of stages of the power converter 160. In practice, the assistance unit 110 with the maintaining signals and the power converter 160 can be adapted according to the requirements of the power converter 160, e.g., the maintaining of voltages in the stages or multiple energy storage elements or units, for maintaining its power signal.

In FIG. 1, the mode controller 140 controls the application of the reference signals VR0-VRn to the power converter 160 selectively by way of switching elements SW0-SWn. When the charge pump 300 is turned on for a chip internal application, e.g., a read command of a memory module, the mode controller 140 turns off all switches SW0 to SWn to disconnect the reference voltage generator 120 from the power converter 160. In another example, the mode controller 140 can further turn off or disable the reference voltage generator 120, e.g., by way of additional switching device(s) to prevent the standby power signal VSTB from applying to internal elements (e.g., resistors) of the reference voltage generator 120.

When the power supply apparatus 100 or the chip where the power supply apparatus 100 is disposed is in an inactive state, such as an idle or standby state or other state in which the power converter 160 needs not be active, the mode controller 140 turns on the reference voltage generator 120, and all switches SW0-SWn accompanies with reference signals VR0-VRn are connected to the corresponding charge pump stages to sustain sufficient charge in the capacitors of the charge pump 300. The charge will sustain at a predetermined value even if the chip is in the idle state for a long time. In an application that the chip is a memory device or module, the charge pump 300 can provide high voltage power immediately in the first clock cycle when a read data command is executed. Thus, all pass gates of the chip for memory reading can apply a high voltage for fully passing data signal, and a sense amplifier of the chip can receive a correct data signal.

For example, the mode controller 140 can be implemented by logic circuitry to detect whether the chip is in an idle state or standby state by way of detecting the state of an internal signal such as a ready or busy signal indicating whether the chip, e.g., a memory module, executes a read or write command or other internal command. In another example, the mode controller 140 can detect a clock signal from a clock source generator (not shown) that provides clock signals CK and CKB for the charge pump 300. If the clock signal is enabled so as to activate the charge pump 300, it indicates that some command is being executed. Conversely, if the clock signal is disabled, it indicates an idle or standby state.

Regarding the implementation of the standby power supply 10, a standby charge pump can be employed, for example. In addition, the standby power supply 10 has a voltage detector (not shown) to detect the standby power signal VSTB, e.g., a voltage signal. If VSTB is lower than a predefined low voltage level, e.g., 6.0V, the detector will deliver an enable signal to refresh the internal voltage of the standby charge pump.

Further, the mode controller 140 controls all switches SW0-SWn, corresponding to each pump stage of the charge pump 300. In this case, the standby power supply 10 is defined to supply the current to compensate for the small current leakage in all internal charge pump stages of the charge pump 300. Since the supply current for compensation is very small, it will not produce a significant power drop on the standby power signal VSTB.

Further, in addition to the example as shown in FIG. 3A, other charge pump with multiple stages can also be employed as the power converter 160 in FIG. 1. For example, Dickson charge pump and other multi-stage N-phase charge pump can also be employed.

Figure 3B:
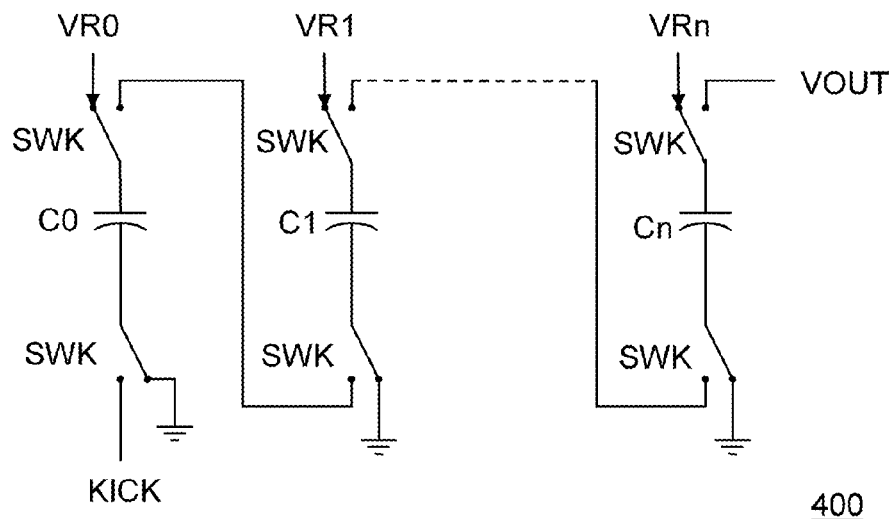
FIG. 3B is another example of a boost circuit serving as the power converter 160 of the power supply apparatus 100 in FIG. 1.

In another example, the power supply apparatus 100 can also be employed for the requirements for other circuit application. For example, a boost circuit can be employed as the power converter 160, instead of the charge pump 300. Referring to FIG. 3B, a boost circuit 400 is shown wherein the reference signals VR0-VRn are applied to the capacitors of the boost circuit 400 when it is in an idle or standby state, for example.

Figure 4:
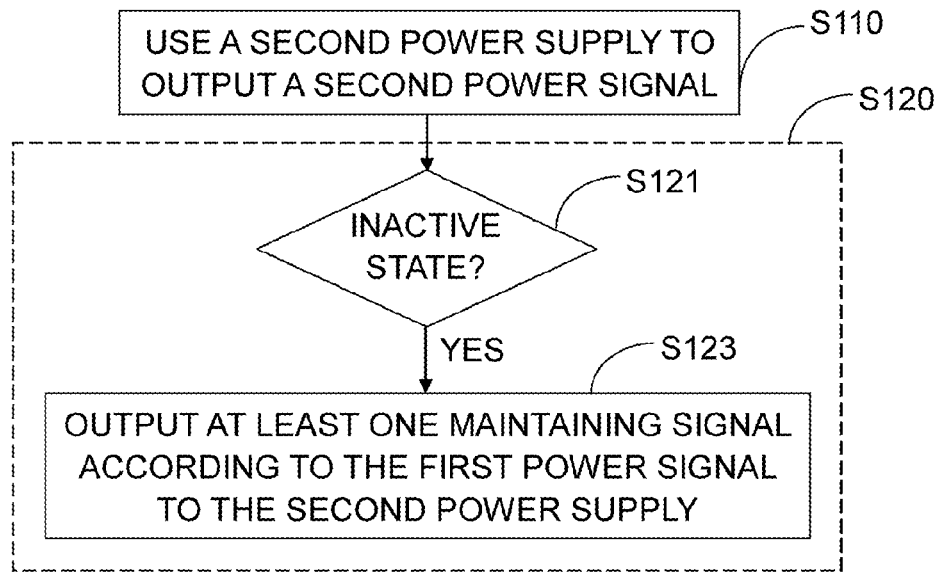
FIG. 4 is a flowchart illustrating a method of supplying power according to a first embodiment of the invention.

Specifically, the boost circuit 400 includes multiple stages, each of which has an energy storage element, such as capacitor C0, C1, . . . , or Cn, as well as switching elements SWK. Referring to FIGS. 1 and 4, when the boost circuit 400 or the chip is in an inactive state, e.g., an idle or standby state, the assistance unit 110 can be used to pre-charge the boost circuit 400. In this case, the reference signals VR0-VRn are applied to all stages of the boost circuit 400, e.g., the capacitors C0-Cn, to maintain a pre-charge voltage before boosting the boost circuit 400, e.g., before a command is executed that needs the output power signal VOUT as their driving power. When a high output voltage VOUT is required, the switching elements SWK are switched and a "kick" signal KICK is enabled, e.g., a clock pulse, and then all the capacitors are connected in series through the switching elements SWK to produce a high voltage signal (VOUT).

Thus, when a read command, for example, is to be executed, the boost circuit 400 can immediately respond and output sufficient power signal VOUT with a significantly reduced noise level. For different requirements of application, the total boost circuit stages can also be reduced so does the power noise, and the output specification needs not to be changed. In contrast to a conventional boost circuit is in boosting phase, there will be a big power noise on the power source line due to its rapid response and higher capacitance in each stage. It is noted that the power noise is direct proportion to the boost circuit stage. This big power noise in the worst case would make the other circuit fail to work.

In further example, the power converter 160 can also be a power converter circuit, similar to or other than those shown in FIG. 3A or 3B, including a plurality of energy storage elements, e.g., capacitive elements, coupled to the maintaining signals to maintain the second power signal selectively. The maintaining signals, in terms of parameters such as signal levels or number of signals, can be designed according to the requirements of the power converter circuit corresponding to the energy storage elements.

A method for supplying power is also provided, as illustrated by the above examples. It is supposed that a first power signal is outputted from a first power supply. The method includes the following steps. As indicated in step S110, a second power supply is used to output a second power signal. Next, in step S120, at least one maintaining signal is outputted selectively according to the first power signal to the second power supply to maintain the second power signal. In an example, step S120 includes the following. It is determined whether an inactive state is entered, as indicated in step S121. If the inactive state is entered, e.g., the second power supply, a chip or circuit module where the second power supply is included, the at least one maintaining signal is outputted according to the first power signal to the second power supply, as indicated in step S123.

SECOND EMBODIMENT

Figure 5A:
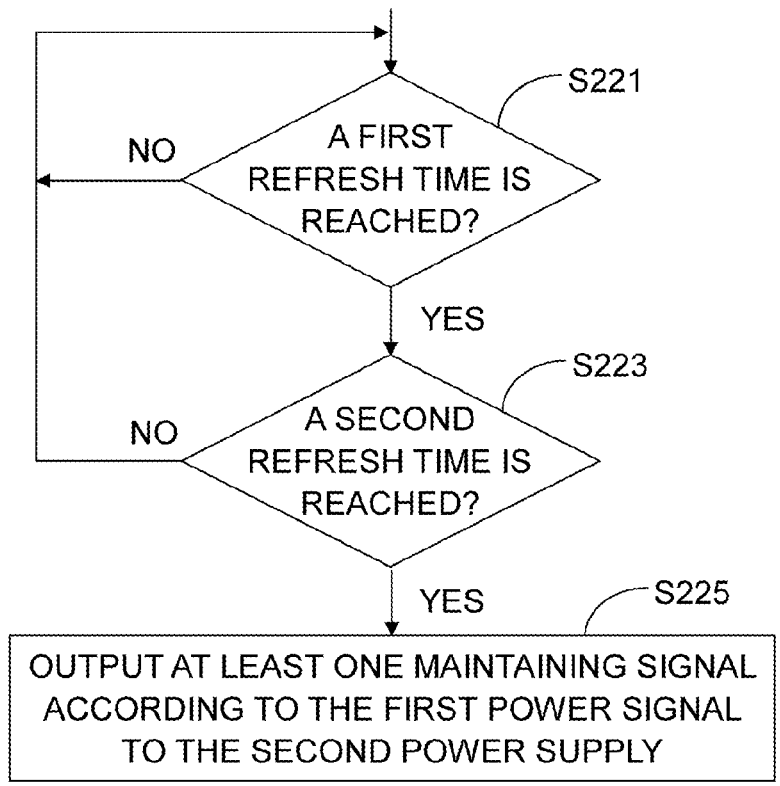
FIG. 5A is a flowchart illustrating a method of supplying power according to a second embodiment of the invention.

In a second embodiment, a standby power supply assists the power supply apparatus by triggering the power supply apparatus to be refreshed with a detection signal of the standby power signal. In this embodiment, at least one maintaining signal is outputted selectively according to the first power signal to the second power supply to maintain the second power signal. Referring to FIGS. 4 and 5A, if an inactive state is entered, it is determined whether a first refresh time of a first power supply is reached, as indicated in step S221. If so, it is determined whether a second refresh time of a second power supply is reached, as in step S223. If the second refresh time is reached, a maintaining signal is outputted to the second power supply to maintain its output voltage, as shown in step S225.

Figure 5B:
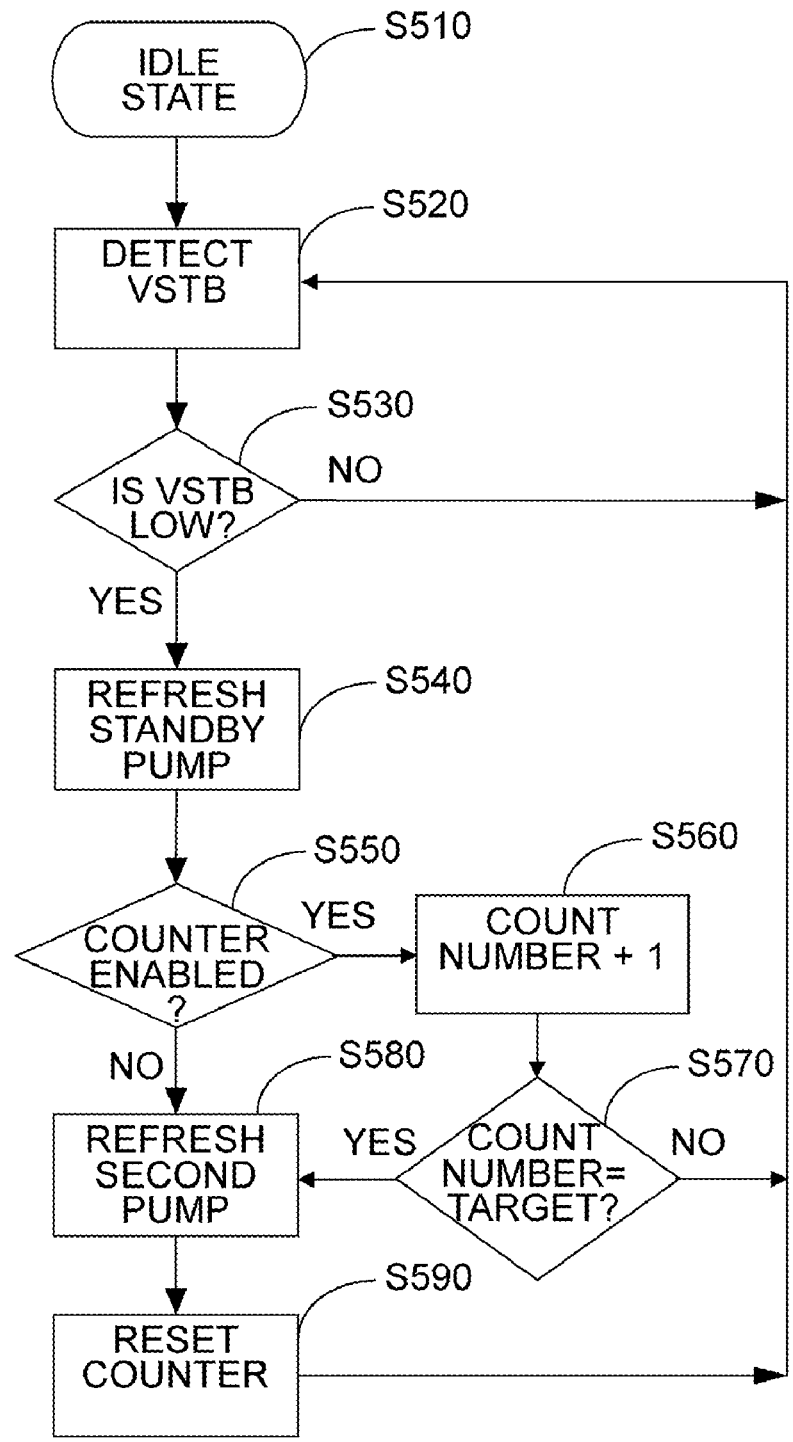
FIG. 5B is a flowchart illustrating a method of supplying power according to the second embodiment of the invention.

Referring to FIG. 5B, an example of a method of supplying power according to the second embodiment is illustrated, wherein a first power supply, e.g., a standby charge pump, is used to trigger a second power supply, e.g., a second charge pump. Initially, a standby charge pump is pumped to the predetermined voltage level, VSTB, e.g., 6V. As indicated by block S510, it is in an idle state. In step S520, a detector will detect VSTB voltage. In step S530, if the VSTB is lower than a value, e.g., 5.7V, the standby charge pump needs to be refreshed, as indicated by step S540. In other words, the confirmation of step S540 indicates the refresh time of the standby charge pump is reached.

In step S550, if a counter employed for the second charge pump is enabled, the count number is increased by one, as indicated by step S560. If the counter number reaches a target value, as indicated in step S570, which indicates that the refresh time of the second charge pump is reached, the second charge pump is refreshed in step S580. Following step S580, the count number of the counter is reset, as in step S590.

In the above example of the embodiment, the target value is used to maintain the second charge pump to refresh in a suitable number of times in an effective manner. For example, if the first and second charge pumps should be refreshed for every 10 ms and 90 ms, respectively, the target number can set to be 9. In this way, the second charge pump will be triggered to refresh in appropriate timing and power consumption for refreshing can be reduced. In other words, the first charge pump with a shorter refresh time is employed as a reference for the triggering of the second charge pump with a longer refresh time.

Additionally, in step S550, if the counter is not enabled, the second charge pump can be refreshed in step S580.

Figure 6:
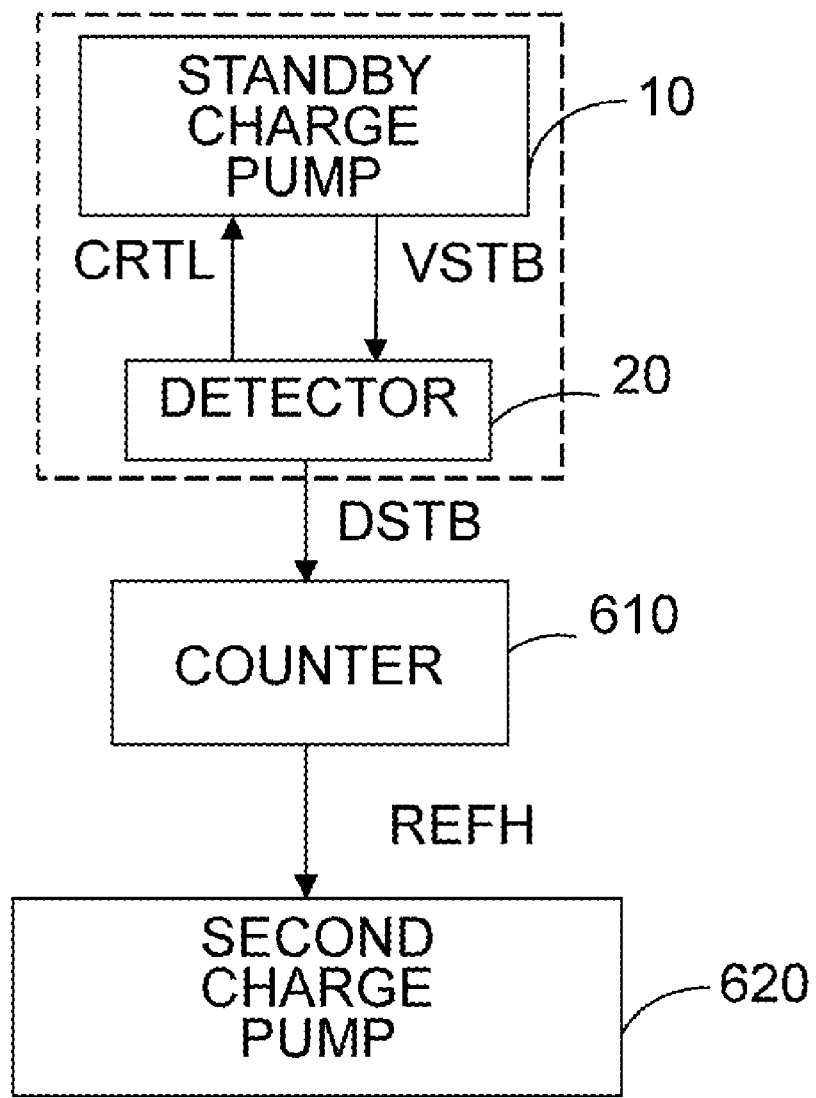
FIG. 6 illustrates a circuit diagram for the implementation of the method as shown in FIG. 5B.

FIG. 6 illustrates a circuit diagram for the implementation of the method as shown in FIG. 5B. In FIG. 6, a detector 20, either internally or externally, is employed to detect the VSTB level of the standby charge pump 10. In addition, the detector 20 outputs a controlled signal CTRL to the standby charge pump 10. If VSTB level is not at a predetermined level, the standby charge pump is in pumping state. If VSTB level reaches the predetermined level, the standby charge pump stops pumping.

It is noted that the second charge pump 620 may consume a huge power when active. A counter 610 is employed to count up the refreshing times of the standby charge pump 10 according to the VSTB detector signal from the detector 20.

When the count number reaches the target number, the counter 610 enables a refresh signal REFH to the second charge pump 620 to trigger the second charge pump 620 to refresh. In an example, the refresh signal REFH is sent to a control circuit or a clock generator or clock source circuit for the second charge pump 620 for refreshing. Thus, the active timing of the second charge pump 620 is lengthened, thus reducing average power consumption.

Specifically, because of the internal elements, such as MOS, in each pump stage is not an ideal component, the VSTB voltage will decrease slowly. If VSTB is too low, the detector 20 outputs a signal from logic low to logic high to enable the standby charge pump 10. If VSTB is too high, the detector 20 outputs a signal from logic high to logic low to disable the standby charge pump 10.

In the same time, the counter 610 is utilized to count the high edge of the detector signal DSTB of the detector 20 to decide whether the second charge pump 620 should be refreshed or not.

Alternatively, the counter 610 can also be disabled. If the counter 610 is disabled, every time the detector 20 outputs the signal DSTB indicating one time of refreshing of the standby charge pump 10 will also enable the second charge pump 620 to refresh. If the counter 610 is enabled, the refresh timing of the second charge pump 620 is based on the count number.

As shown in the second embodiment, the counter 610 can be regarded as an example of an assistance unit for the second embodiment. In another viewpoint, the detector 20 and counter 610 can also be regarded as another example of an assistance unit since the detector makes use of the power signal from the standby charge pump 10 to assist the second charge pump 620 to maintain a high output voltage. In these examples, the assistance unit selectively provides at least one maintaining signal, i.e., the refresh signal REFH, for the second charge pump 620 to maintain its output voltage according to the standby power signal VSTB.

In other examples, the standby charge pump 10 can be used to trigger two or more charge pumps with respective refresh times in similar manners as shown above, wherein one or more counters can be used or with appropriate logic circuitry for determining whether the respective refresh times are reached. In further examples, two or more power supplies can be used to trigger one or more other power supplies via an assistant unit accordingly.

In the above embodiments, a power supply apparatus and a method of supplying power are illustrated. A first power supply is used to assist a second power supply to maintain the output power signal of the second power supply. In brief, the first one shares its output with the second one. In an example of the first embodiment, the standby charge pump is used to share its output signal with the second charge internal pump, leading to the die size of the chip is decreased. In addition, the internal pump voltage is ready for executing a new command and does not need to set up in the beginning. Thus, a better performance can be obtained. In an example of the second embodiment, the use of a counter to decide refreshing timing of the second charge pump, i.e., internal pump, so the standby current can be reduced.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for supplying power, for use in a system having a first power signal, the apparatus comprising:
    an assistance unit for outputting at least one maintaining signal according to the first power signal selectively; and
    a power supply device for outputting a second power signal, wherein the power supply device maintains the second power signal according to at least one maintaining signal;
    wherein the assistance unit produces a plurality of reference signals as at least one maintaining signal according to the first power signal selectively;
    wherein the power supply device comprises a power converter comprising a plurality of stages, the stages receive the reference signals to maintain the second power signal selectively.

2. The power supply apparatus according to claim 1, wherein the power converter is a charge pump circuit or a boost circuit.

3. The power supply apparatus according to claim 1, wherein the power supply device comprises:
    a power converter comprising a plurality of capacitive elements, wherein the capacitive elements are coupled to the reference signals to maintain the second power signal selectively.

4. The power supply apparatus according to claim 1, wherein the assistance unit comprises:
    a reference voltage generator producing a plurality of reference signals according to the first power signal;
    a plurality of switching elements coupled to the power supply device;
    a mode controller controlling the switching elements for outputting the reference signals to the power supply device selectively.

5. The power supply apparatus according to claim 1, wherein the assistance unit outputs at least one maintaining signal to the power supply device in an inactive state to maintain the second power signal according to the first power signal.

6. An apparatus for supplying power, for use in a system having a first power signal, the apparatus comprising:
    an assistance unit for outputting at least one maintaining signal according to the first power signal selectively; and
    a power supply device for outputting a second power signal, wherein the power supply device maintains the second power signal according to at least one maintaining signal;
    wherein the assistance unit comprises:
    a counter, wherein a count number of the counter increases if the first power signal is lower than a predetermined level, and the counter outputs a refreshing signal to the power supply device when the count number reaches a target number.

7. The power supply apparatus according to claim 6, wherein in response to the refreshing signal, the power supply device is refreshed to maintain the second power signal.

8. A method for supplying power, comprising:
    using a second power supply to output a second power signal;
    selectively outputting at least one maintaining signal according to a first power signal from a first power supply to the second power supply to maintain the second power signal;
    wherein the step of selectively outputting at least one maintaining signal comprises:

if an inactive state is entered:
  determining whether a first refresh time of the first power supply is reached;
  determining whether a second refresh time of the second power supply is reached when the first refresh time is reached, wherein the second refresh time is greater than the first refresh time; and
  outputting at least one maintaining signal to the second power supply if it is determined that the second refresh time is reached.

9. The method according to claim 8, wherein the step of selectively outputting at least one maintaining signal comprises:
  determining whether an inactive state is entered; and
  outputting at least one maintaining signal according to the first power signal to the second power supply if the inactive state is entered.

10. The method according to claim 9, wherein a plurality of reference signals are outputted as at least one maintaining signal and the second power supply in the inactive state receives the reference signals to maintain the second power signal.

11. The method according to claim 9, wherein a refreshing signal is outputted as at least one maintaining signal and the method further includes:
  in response to at least one maintaining signal, refreshing the second power supply state in the inactive state to maintain the second power signal.

12. The method according to claim 8, wherein if the first power signal is less than a threshold voltage, it indicates that the first refresh time of the first power supply is reached.

13. The method according to claim 8, wherein if the first refresh time has reached for a predetermined number of times, it indicates that the second refresh time of the first power supply is reached.

14. The method according to claim 8, wherein the method further comprises:
  in response to at least one maintaining signal, refreshing the second power supply state in the inactive state to maintain the second power signal.

* * * * *